US006653704B1

(12) United States Patent
Gurney et al.

(10) Patent No.: US 6,653,704 B1
(45) Date of Patent: Nov. 25, 2003

(54) MAGNETIC MEMORY WITH TUNNEL JUNCTION MEMORY CELLS AND PHASE TRANSITION MATERIAL FOR CONTROLLING CURRENT TO THE CELLS

(75) Inventors: Bruce A. Gurney, San Rafael, CA (US); Stefan Maat, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/254,432

(22) Filed: Sep. 24, 2002

(51) Int. Cl.$^7$ .............................................. H01L 29/82
(52) U.S. Cl. ....................... 257/421; 257/108; 257/295; 257/423; 257/427
(58) Field of Search ................................ 257/108, 252, 257/421–427, 295–313

(56) References Cited

U.S. PATENT DOCUMENTS

| 3,899,407 | A | | 8/1975 | Eastwood et al. |
| 5,640,343 | A | * | 6/1997 | Gallagher et al. .......... 365/171 |
| 5,650,958 | A | | 7/1997 | Gallagher et al. |
| 6,097,625 | A | | 8/2000 | Scheuerlein |
| 6,323,486 | B1 | | 11/2001 | Grossman et al. |

OTHER PUBLICATIONS

M. F. Becker et al., "Femtosecond laser excitation of the semiconductor–metal phase transition in VO2", Appl. Phys. Lett., vol. 65, No. 12, Sep. 19, 1994, pp. 1507–1509.
J.B. MacChesney et al., "Growth and Electrical Properties of vanadium Dioxide Single Cyrstals Containing Selected Impurity Ions", J. Phys. Chem. Solids, Pergamon Press 1969, vol. 30, pp. 225–234.
P.B. Allen et al., "Resistivity of the high–temperature metallic phase of VO2", Physical Review B, Aug. 15, 1993–I, pp. 4359–4363.
J.F. DeNatale et al., "Formation and characterization of grain–oriented VO2 thin films", J. Appl. Phys. 66 (12), Dec. 15, 189, pp. 5844–5850.
C.H. Griffiths et al., "Influence of stoichiometry on the metal–semiconductor transition in vanadium dioxide", J. Appl. Phys., vol. 45, No. 5, May 1974, pp. 2201–2206.

* cited by examiner

Primary Examiner—David Nelms
Assistant Examiner—Andy Huynh
(74) Attorney, Agent, or Firm—Thomas R. Berthold

(57) ABSTRACT

A magnetic random access memory (MRAM) array includes a plurality of magnetic tunnel junction (MTJ) memory cells and a plurality of non-electronic switching elements, each MTJ memory cell and an associated switching element being in electrical series connection and located between the bit and word lines of the array. The switching element is a layer of vanadium dioxide, a material that exhibits a first order phase transition at a transition temperature of approximately 65° C. from a low-temperature monoclinic (semiconducting) to a high-temperature tetragonal (metallic) crystalline structure. This phase transition is accompanied by a change in electrical resistance from high resistance at room temperature to low resistance above the transition temperature. To read a memory cell, the vanadium dioxide switching element associated with that cell is heated to lower the resistance of the switching element to allow sense current to pass through the cell, thereby enabling the memory state of the cell to be read.

11 Claims, 4 Drawing Sheets

MAGNETIC MEMORY WITH TUNNEL JUNCTION MEMORY CELLS AND PHASE TRANSITION MATERIAL FOR CONTROLLING CURRENT TO THE CELLS

TECHNICAL FIELD

This invention relates generally to magnetic random access memory (MRAM) arrays that use magnetic tunnel junction (MTJ) devices as the individual memory cells, and more particularly to an MRAM array with switching elements for controlling sense current to the MTJ cells during the read process.

BACKGROUND OF THE INVENTION

Magnetic tunnel junction (MTJ) devices have been proposed as memory cells for use in a nonvolatile magnetic random access memory (MRAM) arrays. An MTJ device is comprised of two ferromagnetic layers separated by a thin insulating tunnel barrier layer and is based on the phenomenon of spin-polarized electron tunneling. The insulating tunnel barrier layer is thin enough that quantum mechanical tunneling occurs between the ferromagnetic layers. The tunneling phenomenon is electron-spin dependent, making the magnetic response of the MTJ device a function of the relative orientations and spin polarizations of the two ferromagnetic layers. Usually the tunneling probability of the charge carriers is highest when the magnetic moment of the ferromagnetic layer are parallel to one another. Thus, in an MRAM the electrical resistance of an MTJ memory cell is in its lowest state when the magnetic moments or magnetizations of both ferromagnetic layers are parallel, and is in its highest state when the magnetic moments are antiparallel. The basic structure of an MTJ memory cell is described in detail in IBM's U.S. Pat. No. 5,650,598, which also describes an MTJ memory cell wherein one of the ferromagnetic layers has its magnetization fixed or pinned by being exchange coupled with an antiferromagnetic layer and the other ferromagnetic layer is free to have its magnetization rotated in the presence of a magnetic field.

The electrical leads of the MRAM array are referred to as the bit line and the word line. For writing to a cell, current is passed down the bit and word lines. The sum of the magnetic fields that are generated by the current flowing down both lines is able to switch the magnetization of the free ferromagnetic layer in that cell. No current passes through the cell while it is being written. However, during the read process sense current passes from the word line through the cell into the bit line. Depending on the relative orientation of the free and fixed ferromagnetic layers, the cell being read is in either a high or a low resistance state. One problem with an MTJ MRAM is that the cells that are not being read need to be in a significantly higher resistance state than the cells that are being read. Thus, IBM's patents U.S. Pat. No. 5,640,343 and 6,097,635 describe MRAM arrays with MTJ memory cells in series with electronic switching elements, such as diodes, to isolate specific memory cells so that the sense current passes only through the cells being read.

What is needed is an MTJ MRAM array that does not require electronic switching elements for each MTJ memory cell.

SUMMARY OF THE INVENTION

The invention is an MRAM array with a plurality of non-electronic switching elements, each switching element being located between the bit and word lines and in electrical series connection with an associated MTJ memory cell, to enable reading of the memory cells. The switching element is a layer of vanadium dioxide, a material that exhibits a first order phase transition at a transition temperature of approximately 65° C. from a low-temperature monoclinic (semiconducting) to a high-temperature tetragonal (metallic) crystalline structure. This phase transition is accompanied by a change in electrical resistance from high resistance at room temperature to low resistance above the transition temperature. To read a cell, the vanadium dioxide switching element associated with that cell is heated to lower the resistance of the switching element and thereby allow sense current to pass through the cell, thereby enabling the memory state of the cell to be read. Heating of the vanadium dioxide switching element is by application of a voltage pulse directly to the switching element to apply current to resistively heat the switching element. Alternatively, a separate resistive heater is located in electrical contact with or in close proximity to the vanadium dioxide switching element and current is applied to the resistive heater to directly or indirectly heat the switching element. One or more materials, such as Cr, Al, Ga and Ge, can be added in relatively small amounts to the vanadium dioxide to increase the transition temperature without affecting its crystalline structure.

For a fuller understanding of the nature and advantages of the present invention, reference should be made to the following detailed description taken together with the accompanying figures.

DESCRIPTION OF THE INVENTION

Prior Art

Figure 1A:
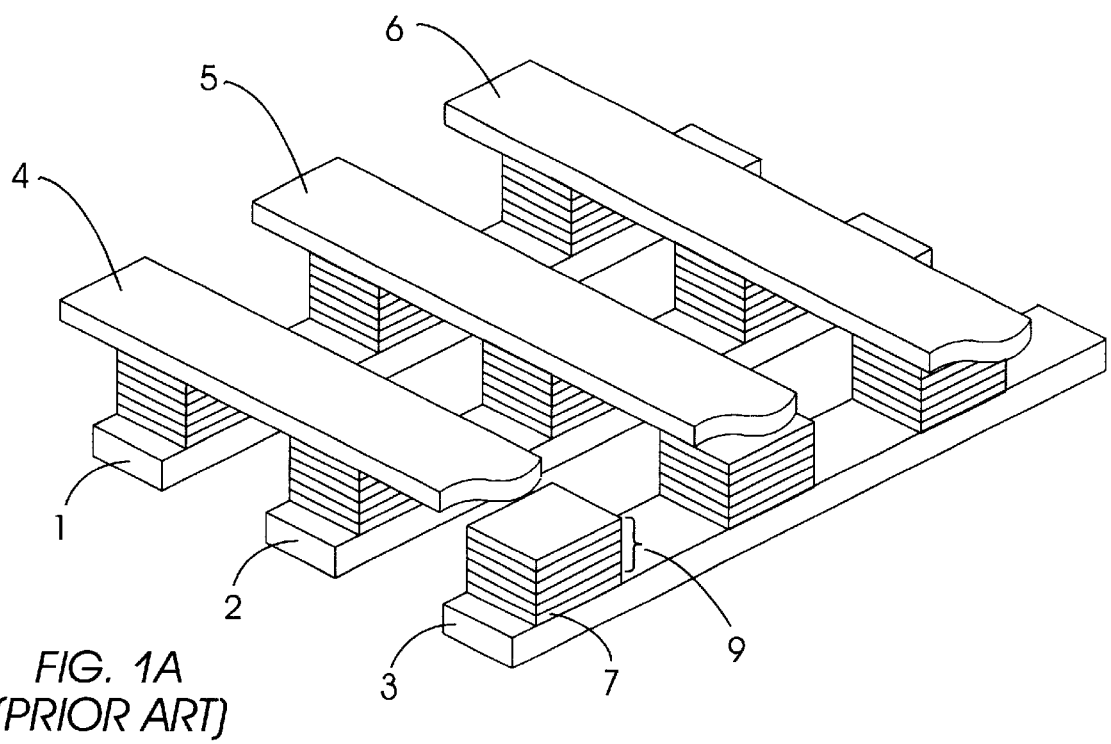
FIG. 1A illustrates the prior art MRAM with MTJ memory cells located vertically between bit and word lines.
Figure 1B:
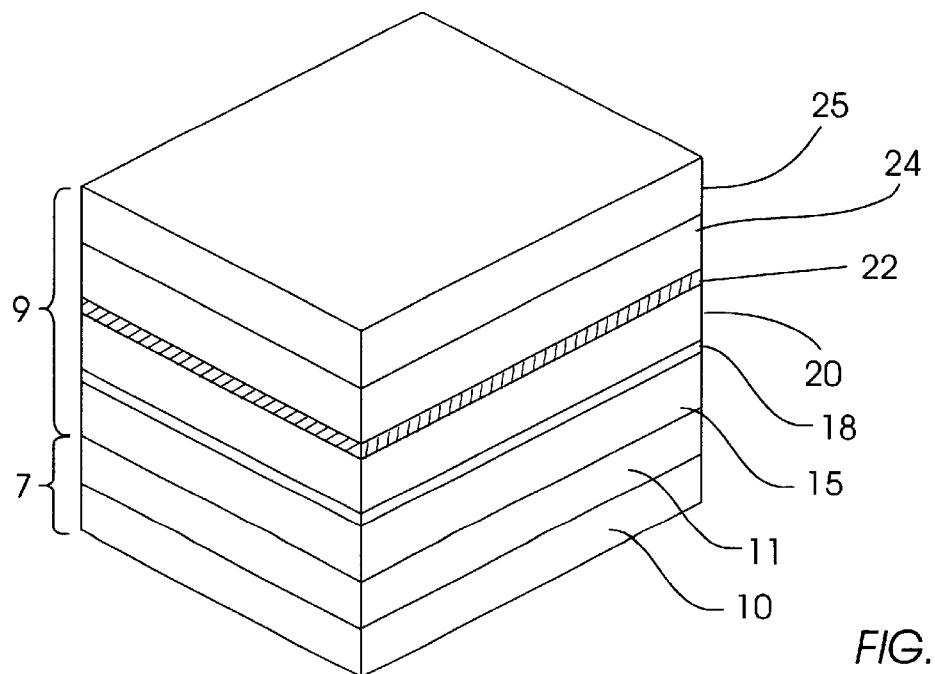
FIG. 1B is an enlarged view of one of the MTJ memory cells shown in the prior art view of FIG. 1A illustrating the individual layers making up the MTJ cell.

The MRAM array of MTJ memory cells as described in the previously cited '343 patent is shown in FIG. 1A. The array includes a set of electrically conductive row lines that function as parallel word lines 1, 2, and 3 in a horizontal plane, and a set of electrically conductive column lines that function as parallel bit lines 4, 5, and 6 in another horizontal plane. The bit lines are oriented in a different direction, preferably at right angles to the word lines, so that the two sets of lines intersect when viewed from above. An MTJ memory cell, such as typical memory cell 9, and a diode 7 in series with the cell 9, as shown in detail in FIG. 1B, are located at each crossing point of the word lines and bit lines in the intersection region vertically spaced between the lines. Three word lines and three bit lines are illustrated in FIG. 1A, but the number of lines would typically be much larger. During a read operation, sense current flows in a vertical direction through the cell 9 and diode 7 to enable the determination of the electrical resistance state and thus the memory state of the cell. The MRAM array is formed on a substrate, such as a silicon substrate, that includes other circuitry. Also, a layer of insulating material is located between the bit lines and word lines at regions of the MRAM array other than the intersecting regions. The bit and word lines and MTJ cells of the MRAM are formed on a silicon-based substrate, typically silicon or silicon-on-insulator (SOI).

The structure of the cell 9 is shown schematically in FIG. 1B. The cell 9 is formed of a series of stacked layers. Cell 9 comprises a template layer 15, such as Pt, an antiferromagnetic layer 18, such as MnFe, NiMn, PtMn or IrMn, a fixed ferromagnetic layer 20, such as CoFe or permalloy (NiFe), a thin tunneling barrier layer 22 of alumina (Al2O3), a free ferromagnetic layer 24, such as CoFe or permalloy, and a contact or capping layer 25, such as Pt or Ta. The cell 9 is shown schematically in FIG. 1B as being on diode 7 which is in contact with a word line 3 (FIG. 1A). The diode 7 is typically a silicon junction diode that comprises an n type silicon layer 10 and a p type silicon layer 11, with layer 11 connected to the cell 9 via a tungsten stud. The diode's n type silicon layer 10 is connected to word line 3. During a write operation current passes through word line 3 and bit line 5 but diode 7 is reverse-biased to prevent current from flowing through cell 9. The combined magnetic fields from the currents through lines 3 and 5 is sufficient to switch the magnetization direction of the free ferromagnetic layer 24, and thereby switch the memory state of cell 9. During a read operation a forward bias voltage is established across the diode 7 so that the sense current can pass through the cell 9 to detect the resistance and thereby the memory state of cell 9.

Preferred Embodiments

In the present invention a layer of vanadium dioxide is located in series with the MTJ memory cell between the word and bit lines to serve as a switching element. A shown in FIGS. 2A–2B, the vanadium dioxide layer 202 is formed on word line 210 and the MTJ cell 203 is formed on the vanadium dioxide layer 202, with the bit line 211 being formed on top of the cell 203. The structure could be inverted from that shown in FIGS. 2A–2B, with cell 203 located on the word line 210 with the vanadium dioxide layer 202 on top of the cell 203.

$VO_2$ is a material that exhibits a first order phase transition at a transition temperature $T_C$ of approximately 65° C. from a low-temperature monoclinic to a high-temperature tetragonal crystalline structure. This transition is accompanied by substantial changes of its electrical and optical properties across the transition. $VO_2$ is semiconducting (high resistance) below the transition temperature and metallic (low resistance) above the transition temperature. This property is not limited to only the stoichiometric vanadium dioxide ($VO_2$) phase. The vanadium oxide phase diagram is complex due to the multivalent vanadium-ion and contains a wide range of ordered and disordered defect structures. In particular it was shown by C. H. Griffiths et al., "Influence of stoichiometry on the metal-semiconductor transition in vanadium dioxide", *J. Appl. Phys.* Vol. 45, No. 5, May 1974, pp. 2201–2206, that oxygen-deficient defect phases of $VO_2$, i.e., ($V_nO_{2n-1}$ where n is greater than or equal to 2), and a mix of $VO_2$ with such oxygen-deficient phases or with a defect phase like $V_6O_{13}$, also exhibit the desired metal-insulator transition. The presence of defects will influence the resistivity values of the semiconducting high-resistance phase and the metallic low-resistance phase as well as the transition temperature. Therefore for purposes of the present invention the term "vanadium dioxide" shall mean those vanadium oxides that exhibit the desired metal-insulator transition, namely the $VO_2$ phase, oxygen-deficient defect phases of $VO_2$, mixtures thereof, and mixtures of one or more such phases with $V_6O_{13}$.

Figure 2A:
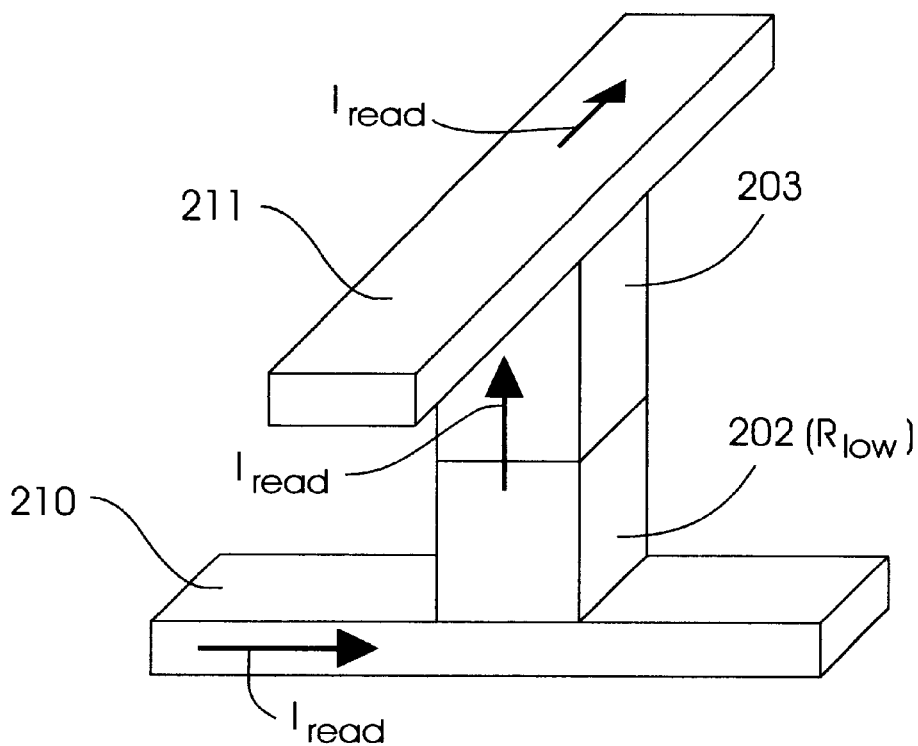
FIG. 2A is a view of a portion of the MRAM according to the present invention showing an MTJ cell and the phase transition material switching element during the read process.
Figure 2B:
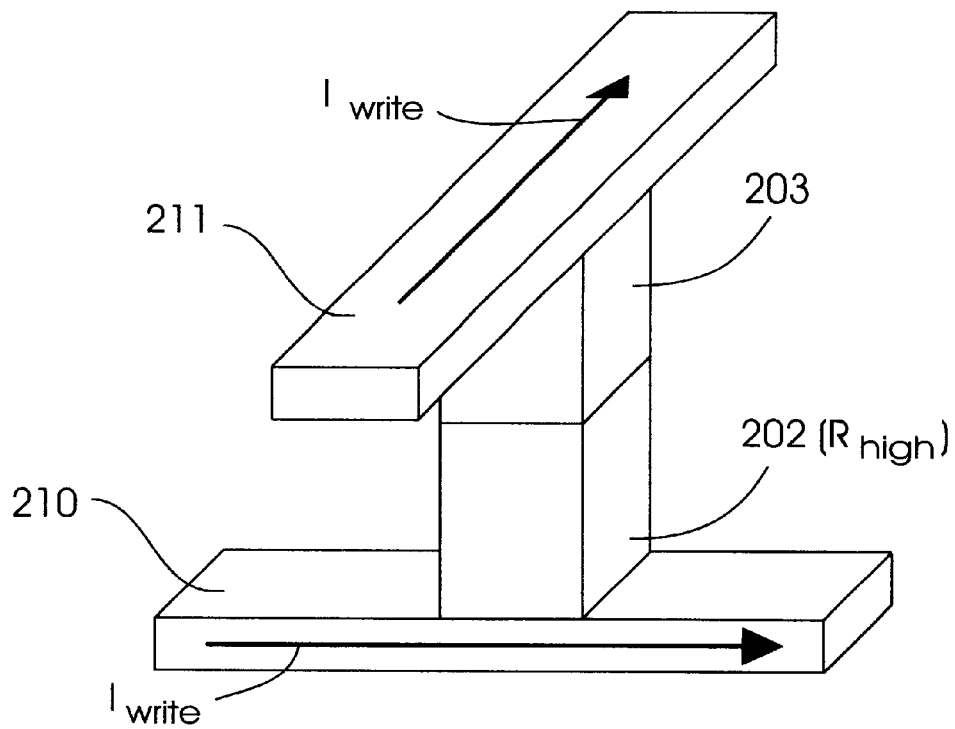
FIG. 2B is a view of a portion of the MRAM according to the present invention showing an MTJ cell and the phase transition material switching element during the write process.

To make use of this property of vanadium dioxide for MRAM, a voltage pulse is applied through suitable MRAM control circuitry across the MTJ cell and vanadium dioxide layer. The voltage pulse supplies enough current to heat the vanadium dioxide layer above $T_C$ due to resistive heating. This voltage pulse thus changes vanadium dioxide to its metal phase (low resistance state) where it has low resistance so that sense current can flow across the addressed MTJ cell during the read process. After the cell has been read, the temperature returns to room temperature (approximately 20–30° C.), which is below $T_C$, and the vanadium dioxide layer is again in its high resistance state. During the write process the vanadium dioxide is in its semiconducting phase (high resistance state) and the write current can not pass through the cell. FIG. 2A shows the read process when the sense current $I_{read}$ passes from word line 210 through the low-resistance vanadium dioxide layer 202 and cell 203 to bit line 211. FIG. 2B shows the write process wherein the much higher write currents $I_{write}$ pass through word line 210 and bit line 211, but are prevented from passing through cell 203 due to the high-resistance vanadium dioxide layer 202.

The value and duration of the voltage pulse is selected to supply the necessary current to heat the vanadium dioxide layer 202 reliably above $T_c$ (for example to approximately 100° C.). The amount of current and the duration of heating depends on the specific MRAM structure, including the geometry, resistance, thermal resistivity and heat capacity of the MTJ cells and vanadium dioxide layers, and can be determined by known numerical simulation techniques.

The switchability of thin vanadium dioxide layers from the semiconducting to the metallic state within a few picoseconds was demonstrated by a pump-probe experiment, as reported by M. F. Becker et al., "Femtosecond laser excitation of the semiconductor-metal phase transition in $VO_2$", *Appl. Phys. Lett.*, Vol. 65, No. 12, 19 Sep. 1994, pp. 1507–1509. This indicates that the vanadium dioxide layers in series with the MTJ memory cells of an MRAM array allows for operation in the GHz range.

The vanadium dioxide layer is preferably less than approximately 4 nm thick, since otherwise it may become difficult to write to the MTJ cell with suitable write currents. For a structure of a 4 nm thick vanadium dioxide layer in series with a 1 $\mu$m×1 $\mu$m square MTJ cell, the resistance across the structure would change from 120 Ω in the semiconducting phase (high resistance state) to 0.8 mΩ in the metallic phase (low resistance state) according to the resistivity values for electron-beam and ion beam deposited $VO_2$ films on alumina being 3 Ωcm in the semiconducting phase and 200 $\mu$Ωcm in the metallic phase, as reported by J. F. DeNatale et al., "Formation and characterization of grain-oriented $VO_2$ thin films", *J. Appl. Phys.* 66 (12), Dec. 15, 1989, pp. 5844–5850.

Figure 3A:
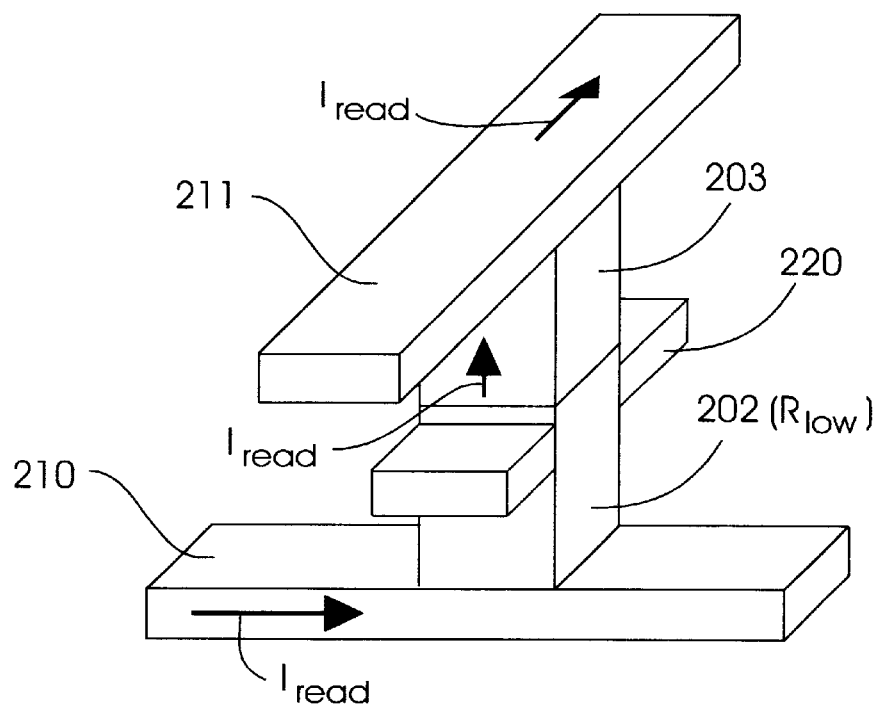
FIG. 3A is a view of a portion of the MRAM according to the present invention showing an MTJ cell and the phase transition material switching element together with a separate resistive heater during the read process.
Figure 3B:
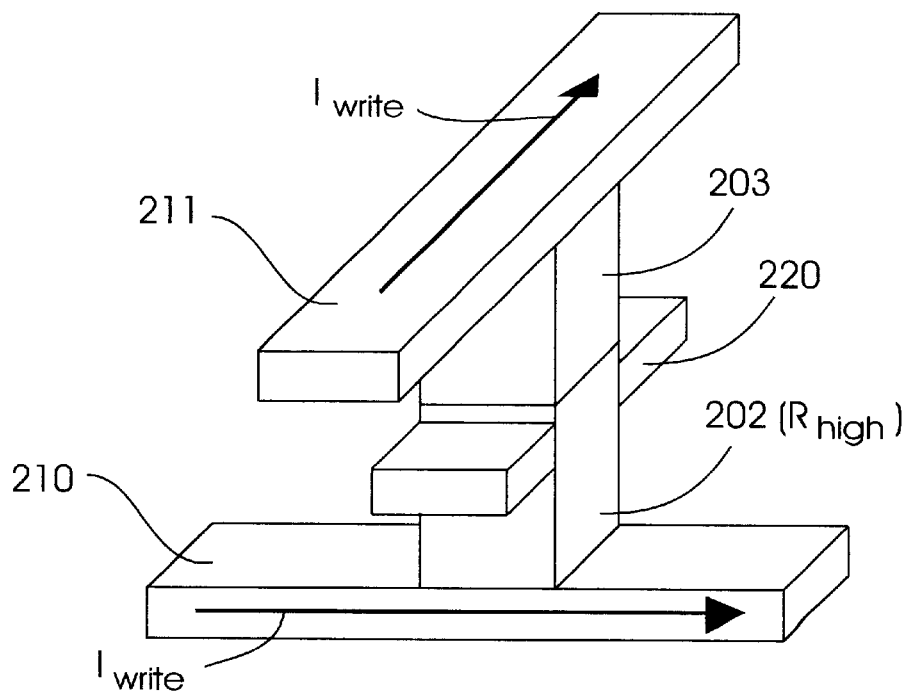
FIG. 3B is a view of a portion of the MRAM according to the present invention showing an MTJ cell and the phase transition material switching element together with a separate resistive heater during the write process.
Figure 4A:
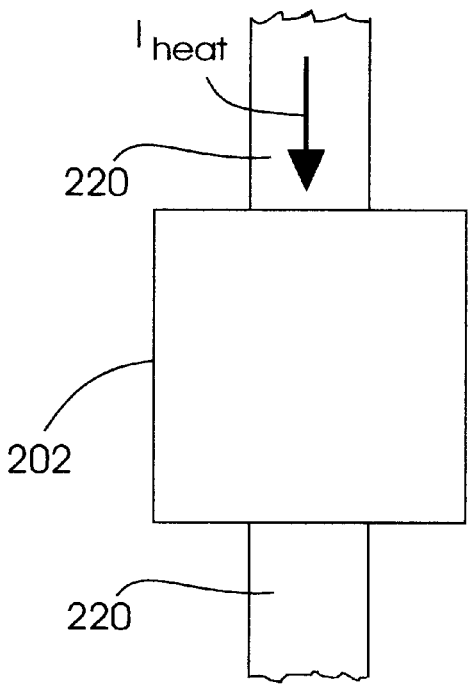
FIG. 4A is a top view of a portion of the MTJ cell and the phase transition material switching element of FIG. 3A showing the connection of the resistive heater to the switching element.
Figure 4B:
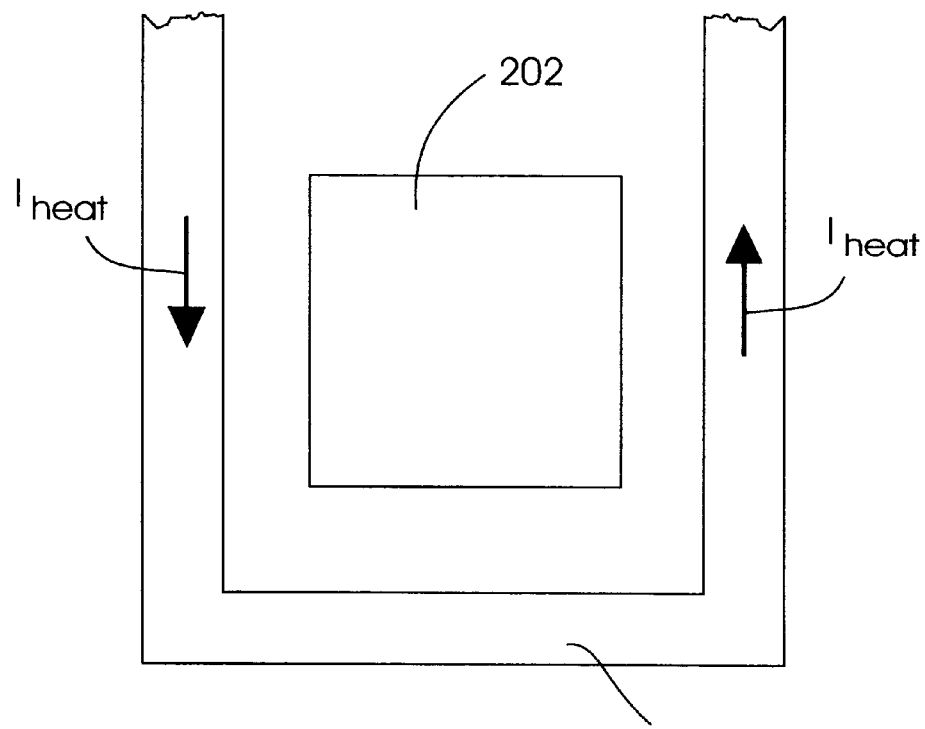
FIG. 4B is a top view of a portion of the MTJ cell and the phase transition material switching element showing an alternative resistive heater for the switching element.

FIGS. 3A–3B illustrate an embodiment of the MRAM wherein a separate resistive heater 220 is used to heat the vanadium dioxide layer 202. A current $I_{heat}$, is passed through the resistive heater 220 to heat the vanadium dioxide layer 202 above its transition temperature, so that it becomes metallic to enable reading the MTJ cell 203. FIG. 3A shows the read process and FIG. 3B shows the write process. A conductor with a relatively high resistance is used for the heater 220, for example a NiCr alloy or an alloy with a substantially similar electrical resistivity (approximately 100–200 $\mu$Ωcm), to obtain heating at relatively low current. FIG. 4A is a top view of the structure in FIGS. 3A–3B and shows the heater 220 in contact with the edges of vanadium dioxide layer 202 so that $I_{heat}$ passes through the vanadium dioxide layer 202. FIG. 4B shows an alternative embodiment wherein the heater 220 is located in close proximity to and surrounds the vanadium dioxide layer 202 so that heat from $I_{heat}$ is conducted to vanadium dioxide layer 202.

The transition in single crystal $VO_2$ can occur over a temperature interval as narrow as 0.1 Kelvin. The hysteresis of the $VO_2$ films is dependent on the method of preparation, but has been reported to be approximately in the range of 1–5° C. in U.S. Pat. No. 6,323,486. The transition temperature can be changed by light doping. For example, 0.35 atomic % tungsten (W) reduces $T_C$ to ~52° C., whereas 4 atomic % and 5 atomic% germanium (Ge) raise $T_C$ to ~80° C. and 85° C., respectively, as described in U.S. Pat. No. 3,899,407. It has been found that doping with atoms with radii smaller than that of $V^{4+}$, such as $Cr^{4+}$, or with ions creating $V^{5+}$ defects, such as $Al^{3+}$ and $Ga^{3+}$, tends to increase the transition temperature, while doping with atoms with radii larger than that of $V^{4+}$, such as $Ti^{4+}$, tends to decrease the transition temperature, implying that the transition temperature is very strain-sensitive, as reported by J. B. MacChesney et al., "Growth and Electrical Properties of vanadium Dioxide Single Crystals Containing Selected Impurity Ions", *J. Phys. Chem. Solids*, Pergamon Press 1969, Vol. 30, pp. 225–234. Thus, the preferred materials which can be doped into $VO_2$ to increase the transition temperature include one or more of Cr, Al, Ga and Ge.

The vanadium dioxide layer can be deposited by reactive sputtering, reactive e-beam, metal-organic epitaxial vapor deposition (MOCVD), or reactive ion-beam deposition. Since the word line on which the vanadium dioxide layer is formed is typically copper, a thin underlayer of ~1 nm thick Ta, Ta-Nitride or Ta-Carbide is deposited onto the copper to prevent interdiffusion. To enhance the single crystal growth of the $VO_2$, a seed layer may be formed on the underlayer or directly on the copper. The main property of the seed layer is that it is a highly crystalline metallic layer with preferred texture. Thus the preferred seed layers include Pt, Ir, Rh, Ru, Pd, NiCr, Cr, NiFe, CrAl, NiCrAl, Ta or their alloys. Next the vanadium dioxide layer is deposited, preferably by reactive sputtering, reactive e-beam, MOCVD, or reactive ion beam deposition. A layer of Pt, Ir, Rh, Ru, Pd, NiCr, Cr, NiFe, CrAl, NiCrAl, Ta, or their alloys may then be deposited on top of the vanadium dioxide layer to serve as a seed layer for the antiferromagnetic layer, which is the first layer in the MTJ cell. If the vanadium dioxide layer is formed on top of the MTJ cell, then a seed layer may be deposited for the $VO_2$. The preferred seed layers include Pt, Ir, Rh, Ru, Pd, NiCr, Cr, NiFe, CrAl, NiCrAl, Ta or their alloys. A top layer of approximately 1 nm thick Ta, Ta-Nitride or Ta-Carbide is then deposited to serve as a diffusion barrier on top of the vanadium dioxide layer to prevent interdiffusion with the Cu metal of the top lead.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic memory array comprising:

a substrate;

a first plurality of electrically conductive lines formed on the substrate;

a second plurality of electrically conductive lines formed on the substrate and overlapping the first plurality of lines at a plurality of intersection regions;

a plurality of magnetic tunnel junction memory cells formed on the substrate, each memory cell being located at an intersection region and electrically connected to one of the first lines and one of the second lines; and a layer comprising vanadium dioxide located at each intersection region, each vanadium dioxide layer being electrically connected with the memory cell in said intersection region.

2. The memory array according to claim 1 further comprising a resistive heater near each layer of vanadium dioxide for heating the vanadium dioxide.

3. The memory array according to claim 2 wherein each resistive heater is in electrical contact with its associated layer of vanadium dioxide.

4. The memory array according to claim 2 wherein each resistive heater is formed of an alloy comprising Ni and Cr.

5. The memory array according to claim 1 wherein the vanadium dioxide layer includes one or more of Cr, Al, Ga and Ge.

6. A magnetic memory array comprising:

a silicon-based substrate;

a first plurality of copper lines formed on the substrate;

a second plurality of copper lines formed on the substrate and overlapping the first plurality of lines at a plurality of intersection regions;

a plurality of magnetic tunnel junction memory cells formed on the substrate, each memory cell being located at an intersection region and electrically connected to one of the first lines and one of the second lines, each memory cell having one of two possible electrical resistance states; and a switching element comprising vanadium dioxide located at each intersection region, each switching element being electrically connected with its associated memory cell in said intersection region, the switching elements having a low-resistance state at room temperature and a high-resistance state above a transition temperature;

sense circuitry connected to each memory cell for directing sense current through each memory cell to determine its electrical resistance state; and means for heating each switching element to above its transition temperature to enable the sense current to pass through the associated memory cell.

7. The memory array according to claim 6 wherein the heating means comprises means for applying a voltage pulse through the copper lines.

8. The memory array according to claim 6 wherein the heating means comprises a resistive heater near each switching element.

9. The memory array according to claim 8 wherein each resistive heater is in electrical contact with its associated switching element.

10. The memory array according to claim 8 wherein each resistive heater is formed of an alloy comprising Ni and Cr.

11. The memory array according to claim 6 wherein the switching element includes one or more of Cr, Al, Ga and Ge for increasing the transition temperature.

* * * * *